US009721498B2

United States Patent
Jeon

(10) Patent No.: US 9,721,498 B2
(45) Date of Patent: Aug. 1, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Mu Kyung Jeon, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 335 days.

(21) Appl. No.: 14/250,568

(22) Filed: Apr. 11, 2014

(65) Prior Publication Data

US 2015/0130691 A1    May 14, 2015

(30) Foreign Application Priority Data

Nov. 11, 2013 (KR) .................. 10-2013-0136378

(51) Int. Cl.
*G09G 3/32* (2016.01)
*G09G 3/3225* (2016.01)
*H01L 27/32* (2006.01)

(52) U.S. Cl.
CPC ...... *G09G 3/3225* (2013.01); *G09G 2300/0861* (2013.01); *G09G 2310/0216* (2013.01); *G09G 2310/0262* (2013.01); *H01L 27/3262* (2013.01); *H01L 27/3265* (2013.01); *H01L 27/3276* (2013.01)

(58) Field of Classification Search
CPC ... G09G 2300/0861; G09G 2310/0216; G09G 2310/0262; G09G 3/3225; G09G 3/32; H01L 27/3262; H01L 27/3265; H01L 27/3276
See application file for complete search history.

(56) References Cited

U.S. PATENT DOCUMENTS

| 2005/0179625 | A1* | 8/2005 | Choi ............... | G09G 3/3233 345/76 |
| 2011/0175862 | A1* | 7/2011 | Umezaki .......... | G09G 3/3233 345/204 |
| 2014/0062844 | A1* | 3/2014 | Yamamoto ....... | G09G 3/3225 345/80 |

FOREIGN PATENT DOCUMENTS

| KR | 10-0801961 B1 | 1/2008 |
| KR | 10-2008-0046508 A | 5/2008 |
| KR | 10-0952111 B1 | 4/2010 |
| KR | 10-1048965 B1 | 7/2011 |

(Continued)

*Primary Examiner* — Lun-Yi Lao
*Assistant Examiner* — Jarurat Suteerawongsa
(74) *Attorney, Agent, or Firm* — Lee & Morse, P.C.

(57) ABSTRACT

An OLED pixel includes a switching transistor to transfer a data signal to a driving transistor. The switching transistor includes a first gate coupled to receive a first scan signal and a second gate coupled to receive a second scan signal received before the first scan signal. A storage capacitor is connected to a first terminal of the driving transistor and the first transistor passes a data signal to a second terminal of the driving transistor based on the first and second scan signals. A compensation transistor and an initialization transistor are also included. The compensation transistor includes first and second gates to receive the first scan signal to establish a signal path between the first terminal and a third terminal of the driving transistor. The initialization transistor establishes a signal path between an initialization voltage and the storage capacitor between its two gates.

17 Claims, 10 Drawing Sheets

(56) References Cited

FOREIGN PATENT DOCUMENTS

KR    10-2014-0045170 A    4/2014

\* cited by examiner

ORGANIC LIGHT EMITTING DIODE DISPLAY

CROSS-REFERENCE TO RELATED APPLICATION

Korean Patent Application No. 10-2013-0136378, filed on Nov. 11, 2013, and entitled, "Organic Light Emitting Diode Display," is incorporated herein by reference in its entirety.

BACKGROUND

1. Field

One or more embodiments described herein relate to a display device.

2. Description of the Related Art

An organic light emitting diode display includes a plurality of pixels, each of which includes an organic emission layer between two electrodes. In operation, electrons from one of the electrodes and holes from the other electrode combine in the organic emission layer to generate excitons for emitting light.

Each pixel may also include uses a plurality of transistors and at least one capacitor to control light emission. The transistors include a driving transistor and a plurality of switching transistors. These transistors drive an organic light emitting diode, which includes the organic emission layer, based on various control signals.

In operation, the organic light emitting diode may emit light that changes from a darker level to a lighter level (e.g., from black to white) according to driving current Id received by the organic light emitting diode. The magnitude of the driving current is controlled by the driving transistor based on a gate voltage. The difference between gate voltages that correspond black and white levels of light may be referred to as the gate-voltage driving range.

Organic light emitting diode (OLED) displays of the aforementioned type have a number of drawbacks. For example, pixel size tends to decrease as screen resolution increases. A decreased pixel size may cause the amount of current flowing in each pixel to decrease, which, in turn, narrows gate-voltage driving range of the driving transistor. A narrower gate-voltage driving range may reduce the number of gray scale levels each pixel is able to emit and/or increases the difficulty of controlling the gate voltage for purposes of producing a desired gray scale level.

Further, hysteresis may occur as a result of an off-bias state corresponding to emission of a dark (or black) level of light and on-bias state corresponding to emission of a lighter (e.g., white) level of light. This hysteresis may limit the response speed of the display device in a way that adversely affects luminance, especially in the case where pixel luminance changes between darker and lighter light levels.

Further, a full HD (FHD, e.g., 1920×1080 pixels) OLED display may use one or more dual-gate transistors to reduce off current. However, in a UHD OLED display, when the size of the pixel is decreased, for example, to 800PPI (Pixel Per Inch), it may be difficult to use dual-gate transistors, because the area of the storage capacitor in each pixel is reduced and the off current may be further decreased to an insufficient level.

SUMMARY

In accordance with one embodiment, a display device including a substrate; a scan line and a previous scan line formed on the substrate, the scan line to transfer a scan signal and the previous scan line to transfer a previous scan signal; a data line and a driving voltage line crossing the scan line, the data line to transfer a data signal and the driving voltage line to transfer a driving voltage; a switching transistor connected to the scan line, previous scan line, and data line; a driving transistor connected to the switching transistor; and an organic light emitting diode connected to the driving transistor, wherein the switching transistor includes a first switching gate electrode and a second switching gate electrode on different layers, and wherein the previous scan signal is transferred to the first switching gate electrode and the scan signal is transferred to the second switching gate electrode.

The first switching gate electrode and second switching gate electrode may overlap the switching semiconductor layer. The display device may include a first back bias line on the substrate, where the first switching gate electrode is part of the first back bias line.

The display device may include a first gate insulating layer over the first back bias line; a semiconductor layer including a switching semiconductor layer and a driving semiconductor layer on the first gate insulating layer; a second gate insulating layer over the semiconductor layer; and a third gate insulating layer on the second gate insulating layer and over the second switching gate electrode to overlap the switching semiconductor layer. The first switching gate electrode may be connected to the previous scan line, and the second switching gate electrode may be a part of the scan line.

The first back bias line and the previous scan line may be on different layers, and the first back bias line may be connected to the previous scan line through a contact hole in the first gate insulating layer and second gate insulating layer. An initialization voltage line may transfer a voltage to initialize the driving transistor; and an initialization transistor may transfer the initializing voltage to a driving gate electrode of the driving transistor based on the previous scan signal.

The initialization transistor may includes a first initialization gate electrode and a second initialization gate electrode on different layers, and the first initialization gate electrode and the second initialization gate electrode are connected to the previous scan line. The first initialization gate electrode may be a part of the first back bias line.

The display device may include a compensation transistor to compensate for a threshold voltage of the driving transistor based the scan signal. The compensation transistor may include a compensation gate electrode including a first compensation gate electrode and a second compensation gate electrode on different layers, the first and second compensation gate electrodes connected to the scan line.

The display device may include a second back bias line overlapping a part of the compensation transistor and formed on a same layer as the first back bias line. The first compensation gate electrode may be a part of the second back bias line. The driving semiconductor layer has at least one curve or bend.

The display device may include a storage capacitor including a first storage capacitor plate corresponding to the driving gate electrode on the second gate insulating layer and overlapping the driving semiconductor layer; and a second storage capacitor plate on the third gate insulating layer over the first storage capacitor plate.

The display device may include an interlayer insulating layer over the second storage capacitor; a data line, a driving voltage line, and a connector on the interlayer insulating layer, the data line to transfer a data signal and the driving voltage line to transfer a driving voltage; and a passivation layer over the interlayer insulating layer, the data line, the driving voltage line, and the connector, wherein the connector member connects a capacitance opening in the second storage capacitor plate and the first storage capacitor plate and the compensation drain electrode of the compensation thin film transistor through a contact hole, the contact hole included in a capacitance opening in the second storage capacitor plate, the third gate insulating layer, and the interlayer insulating layer.

The scan line and the previous scan line may be on a same layer as the first storage capacitor plate. Also, the driving voltage line may be connected to the second storage capacitor plate through a contact hole in the interlayer insulating layer. Also, the previous scan signal may be transferred to the first switching gate electrode through the first back bias line, and the second switching gate electrode may be a part of the scan line. The first back bias line may be separated from the previous scan line.

The initialization voltage line may transfer a voltage to initialize the driving transistor; and an initialization transistor may transfer the initializing voltage to the driving gate electrode of the driving transistor based on the previous scan signal, wherein the initialization transistor includes a first initialization gate electrode and a second initialization gate electrode on different layers, and wherein the first initialization gate electrode is a part of the first back bias line and the second initialization gate electrode is a part of the previous scan line.

In accordance with another embodiment, a pixel includes a driving transistor; an organic light emitting diode; a storage capacitor connected to the driving transistor; and first transistor to transfer a data signal to the driving transistor, wherein the first transistor includes a first gate coupled to receive a first scan signal and a second gate coupled to receive a second scan signal received before the first scan signal, and wherein the storage capacitor is connected to a first terminal of the driving transistor and the first transistor passes a data signal to a second terminal of the driving transistor based on the first and second scan signals, the first terminal corresponding to a gate of the driving transistor and the driving transistor coupled to the organic light emitting diode.

The display device may include a second transistor to compensate a threshold voltage of the driving transistor; and a third transistor including first and second gates coupled to receive the second scan signal, wherein the second transistor includes first and second gates to receive the first scan signal to establish a signal path between the first terminal and a third terminal of the driving transistor, and wherein the third transistor establishes a signal path between an initialization voltage and the storage capacitor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
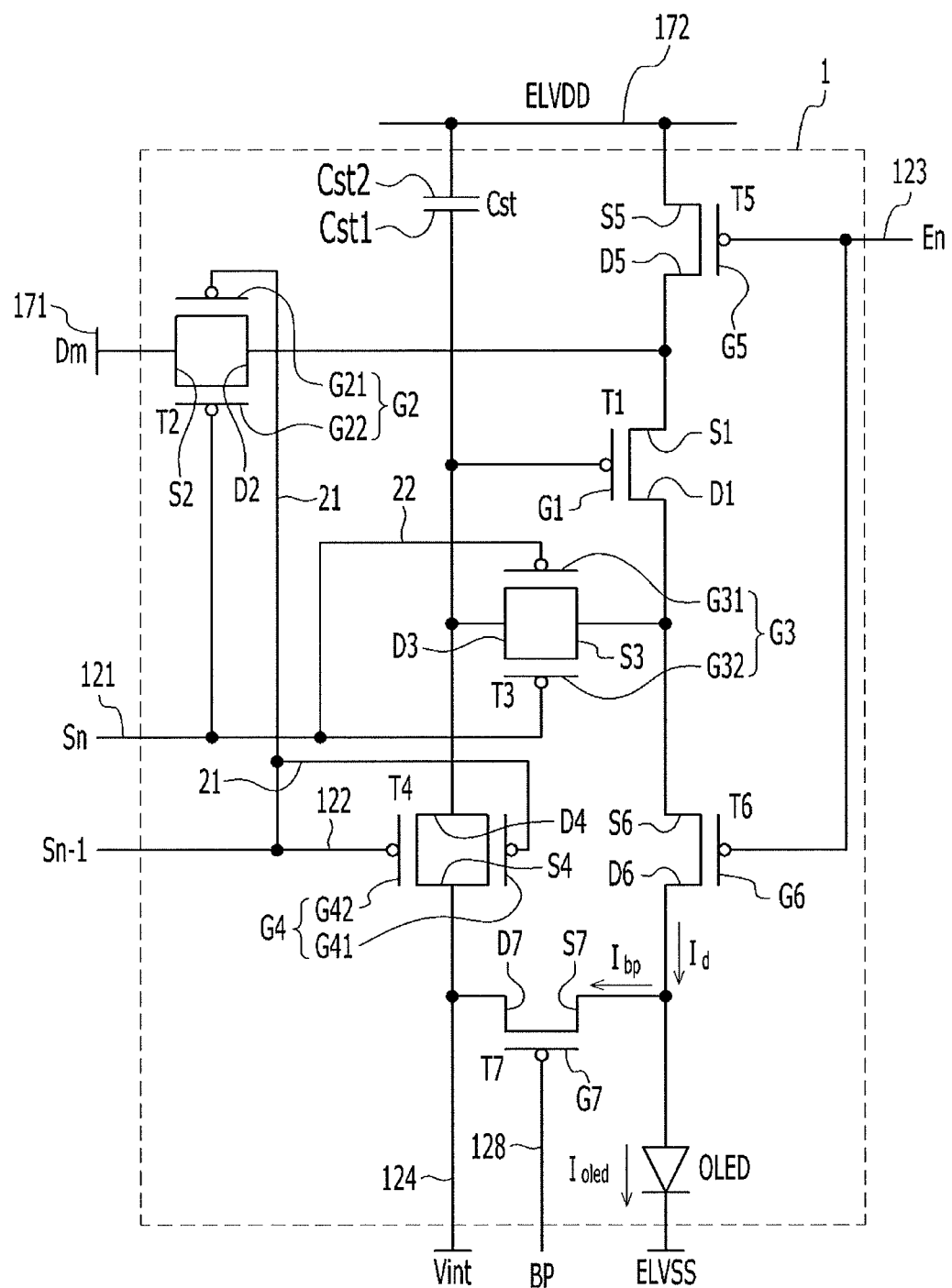
FIG. 1 illustrates an embodiment of a pixel in an OLED display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is an equivalent circuit diagram of one embodiment of a pixel 1 of an organic light emitting diode display device. As illustrated in FIG. 1, pixel 1 includes a plurality of signal lines 121, 122, 123, 124, 128, 171, and 172, a plurality of thin film transistors T1, T2, T3, T4, T5, T6, and T7 connected to the plurality of signal lines, a storage capacitor Cst, and an organic light emitting diode OLED.

The transistors include a driving thin film transistor T1, a switching thin film transistor T2, a compensation transistor T3, an initialization transistor T4, an operation control transistor T5, an emission control transistor T6, and a bypass transistor T7(a).

The signal lines include a scan line 121 transferring a scan signal Sn, a previous scan line 122 transferring a previous scan signal Sn−1 to the initialization transistor T4, an emission control line 123 transferring an emission control signal En to the operation control transistor T5 and the emission control transistor T6, and an initialization voltage line 124 transferring an initialization voltage Vint initializing the driving thin film transistor T1. The signal lines also include a bypass control line 128 transferring a bypass signal BP to the bypass thin film transistor T7, a data line 171 crossing the scan line 121 and transferring a data signal Dm, and a driving voltage line 172 transferring a driving voltage ELVDD and formed substantially parallel with the data line 171.

A gate electrode G1 of the driving thin film transistor T1 is connected to one end Cst1 of the storage capacitor Cst. A source electrode S1 of the driving thin film transistor T1 is connected to the driving voltage line 172 via the operation control transistor T5. A drain electrode D1 of the driving thin film transistor T1 is electrically connected to an anode of the organic light emitting diode OLED via the emission control transistor T6. The driving thin film transistor T1 receives the data signal Dm according to a switching operation of the switching thin film transistor T2 and supplies a driving current Id to the organic light emitting diode OLED.

A gate electrode G2 of the switching thin film transistor T2 includes a first gate electrode G21 and a second gate electrode G22. The first gate electrode G21 is connected to the previous scan line 122 through a first back bias line 21. The second gate electrode G22 is connected to the scan line 121. In addition, a source electrode S2 of the switching thin film transistor T2 is connected to the data line 171. A drain electrode D2 of the switching thin film transistor T2 is connected to the source electrode Si of the driving thin film transistor Ti and the driving voltage line 172 via the operation control transistor T5. The switching thin film transistor T2 is turned on according to the scan signal Sn received through the scan line 121, and performs a switching operation to transfer the data signal Dm, transferred to the data line 171, to the source electrode of the driving thin film transistor T1.

In addition, since the previous scan signal Sn−1 is transferred to the first gate electrode G21 of the switching thin film transistor T2 through the first back bias line 21, the switching thin film transistor T2 is turned on by the previous scan signal Sn−1 before the switching operation performed by transistor T2 based on the scan signal. Thus, an on-bias data signal is applied to the driving thin film transistor T1. The on-bias data signal may be applied continuously to the driving thin film transistor T1. As a result, hysterisis due to a difference between the off-bias state and on-bias state does not occur, thereby improving response speed.

A gate electrode G3 of the compensation transistor T3 includes a first gate electrode G31 and a second gate electrode G32. The first gate electrode G31 is connected to the scan line 121 through a second back bias line 22. The second gate electrode G32 is directly connected to the scan line 121. In addition, a source electrode S3 of the compensation transistor T3 is connected to the drain electrode D1 of the driving thin film transistor T1, and is also connected to the anode of the organic light emitting diode OLED via the emission control transistor T6.

The drain electrode D3 of the compensation transistor T3 is connected to one end Cst1 of the storage capacitor Cst, drain electrode D4 of the initialization transistor T4, and gate electrode G1 of the driving thin film transistor T1. The compensation transistor T3 is turned on according to the scan signal Sn received through the scan line 121, to connect the gate electrode G1 and the drain electrode D1 of the driving thin film transistor T1 and diode-connect the driving thin film transistor T1. In addition, since the scan signal Sn is transferred to the compensation transistor T3 through the second back bias line 22, the same off-voltage is simultaneously applied to the first gate electrode G31 and the second gate electrode G32 of the compensation transistor T3, thereby reducing or minimizing off current.

A gate electrode G4 of the initialization transistor T4 includes a first gate electrode G41 and a second gate electrode G42. The first gate electrode G41 is connected to the previous scan line 122 through a first back bias line 21. The second gate electrode G42 is directly connected to the scan line 122.

In addition, a source electrode S4 of the initialization transistor T4 is connected to an initialization voltage line 124. The drain electrode D4 of the initialization transistor T4 is connected to one end Cst1 of the storage capacitor Cst, drain electrode D3 of the compensation transistor T3, and gate electrode G1 of the driving thin film transistor T1. The initialization transistor T4 is turned on according to the previous scan signal Sn−1 received through the previous scan line 122. When the initialization transistor T4 is turned on, the initialization voltage Vint is transferred to the gate electrode G1 of the driving thin film transistor T1. An initialization operation of initializing a voltage of the gate electrode G1 of the driving thin film transistor T1 is then performed. Because the previous scan signal Sn−1 is transferred to the initialization transistor T4 through the first back bias line 21, the same off-voltage is simultaneously applied to the first gate electrode G41 and second gate electrode G42 of the initialization transistor T4, thereby reducing or minimizing an off current.

A gate electrode G5 of the operation control transistor T5 is connected to the emission control line 123. A source electrode S5 of the operation control transistor T5 is connected to the driving voltage line 172. A drain electrode D5 of the operation control transistor T5 is connected to the source electrode S1 of the driving thin film transistor T1 and the drain electrode S2 of the switching thin film transistor T2.

A gate electrode G6 of the emission control transistor T6 is connected to the emission control line 123. A source electrode S6 of the emission control transistor T6 is connected to the drain electrode D1 of the driving thin film transistor T1 and the source electrode S3 of the compensation transistor T3. A drain electrode D6 of the emission control transistor T6 is electrically connected to an anode of the organic light emitting diode OLED. The operation control transistor T5 and the emission control transistor T6 are simultaneously turned on according to the emission control signal En received through the emission control line 123. Also, the driving voltage ELVDD is transferred to the organic light emitting diode OLED. As a result, an emission current Ioled flows in the organic light emitting diode OLED.

A gate electrode G7 of the bypass thin film transistor T7 is connected to a bypass control line 128. A source electrode S7 of the bypass thin film transistor T7 is connected to the drain electrode D6 of the emission control thin film transistor T6 and an anode of the organic light emitting diode OLED. A drain electrode D7 of the bypass thin film transistor T7 is connected to the initialization voltage line 124 and the source electrode S4 of the initialization thin film transistor T4 together.

The other end Cst2 of the storage capacitor Cst is connected to the driving voltage line 172. A cathode of the organic light emitting diode OLED is connected to a common voltage ELVSS. As a result, the organic light emitting diode OLED receives the emission current Ioled from the driving thin film transistor T1 to emit light, and thereby display an image.

Figure 2:
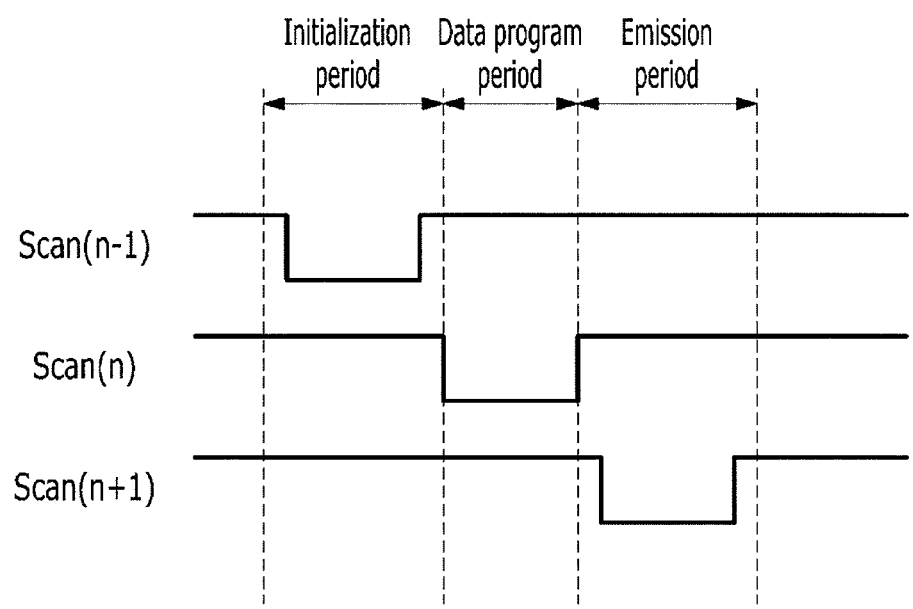
FIG. 2 illustrates an embodiment of a timing diagram for the device of FIG. 1.

FIG. 2 illustrates one embodiment of a timing diagram for controlling operation of the organic light emitting diode display device. As illustrated in FIG. 2, in an initialization period, the previous scan signal Sn−1 having a low level is supplied through the previous scan line 122. The initialization thin film transistor T4 is turned on in response to the previous scan signal Sn−1 having the low level. The initialization voltage Vint is connected to the gate electrode of the driving thin film transistor T1 through the initialization thin film transistor T4 from the initialization voltage line 124. Then, the driving thin film transistor T1 is initialized by the initialization voltage Vint. In this case, the switching thin film transistor T2 is turned on by the previous scan signal Sn−1, and thus an on-bias data signal is applied to driving thin film transistor Ti.

Thereafter, in a data programming period, the scan signal Sn at the low level is supplied through scan line 121. Then, the switching thin film transistor T2 and compensation transistor T3 are turned on in response to the low-level scan signal Sn.

In this case, the driving thin film transistor T1 is diode-connected by the turned-on compensation transistor T3 and biased in a forward direction. Then, a compensation voltage Dm+Vth (Vth is a negative (−) value) is generated. The compensation voltage corresponds to a voltage of a data signal Dm reduced by a threshold voltage Vth of the driving thin film transistor T1. The compensation voltage is applied to the gate electrode of the driving thin film transistor T1.

The driving voltage ELVDD and the compensation voltage are applied to respective ends of the storage capacitor Cst, and a charge corresponding to a difference between these voltages is stored in the storage capacitor Cst. Thereafter, in an emission period, the emission control signal En supplied from the emission control line 123 is changed from the high level to the low level. Then, the operation control transistor T5 and the emission control transistor T6 are turned on by the emission control signal En of the low level for the emission period.

Then, a driving current ld is generated according to a voltage difference between the voltage of the gate electrode of the driving thin film transistor T1 and the driving voltage ELVDD. The driving current Id is supplied to the organic light emitting diode OLED through the emission control transistor T6. The gate-source voltage Vgs of the driving thin film transistor T1 is maintained as (Dm+Vth)-ELVDD by the storage capacitor Cst for the emission period. According to a current-voltage relationship of the driving thin film transistor T1, the driving current ld is proportional to a square $(Dm-ELVDD)^2$ of a value obtained by subtracting the threshold voltage from the source-gate voltage. Accordingly, the driving current Id is determined regardless of the threshold voltage Vth of the driving thin film transistor T1.

In this case, the bypass transistor T7 receives a bypass signal BP from the bypass control line 128. The bypass signal BP is a voltage having a predetermined level, which always turns off the bypass transistor T7. The bypass transistor T7 receives a voltage having a transistor off-level from the gate electrode G7. Thus, the bypass transistor T7 is always turned off and a part of the driving current ld flows out through the bypass transistor T7 as bypass current Ibp.

Accordingly, when a driving current displaying a black image flows, the emission current Ioled of the organic light emitting diode (which is reduced by the amount of current of the bypass current Ibp, which flows out from the driving current ld through the bypass transistor T7) has a minimum current amount which corresponds to a level which may exactly express the black image. Therefore, a black luminance image is exactly implemented using the bypass transistor T7, thereby improving contrast ratio.

Figure 3:
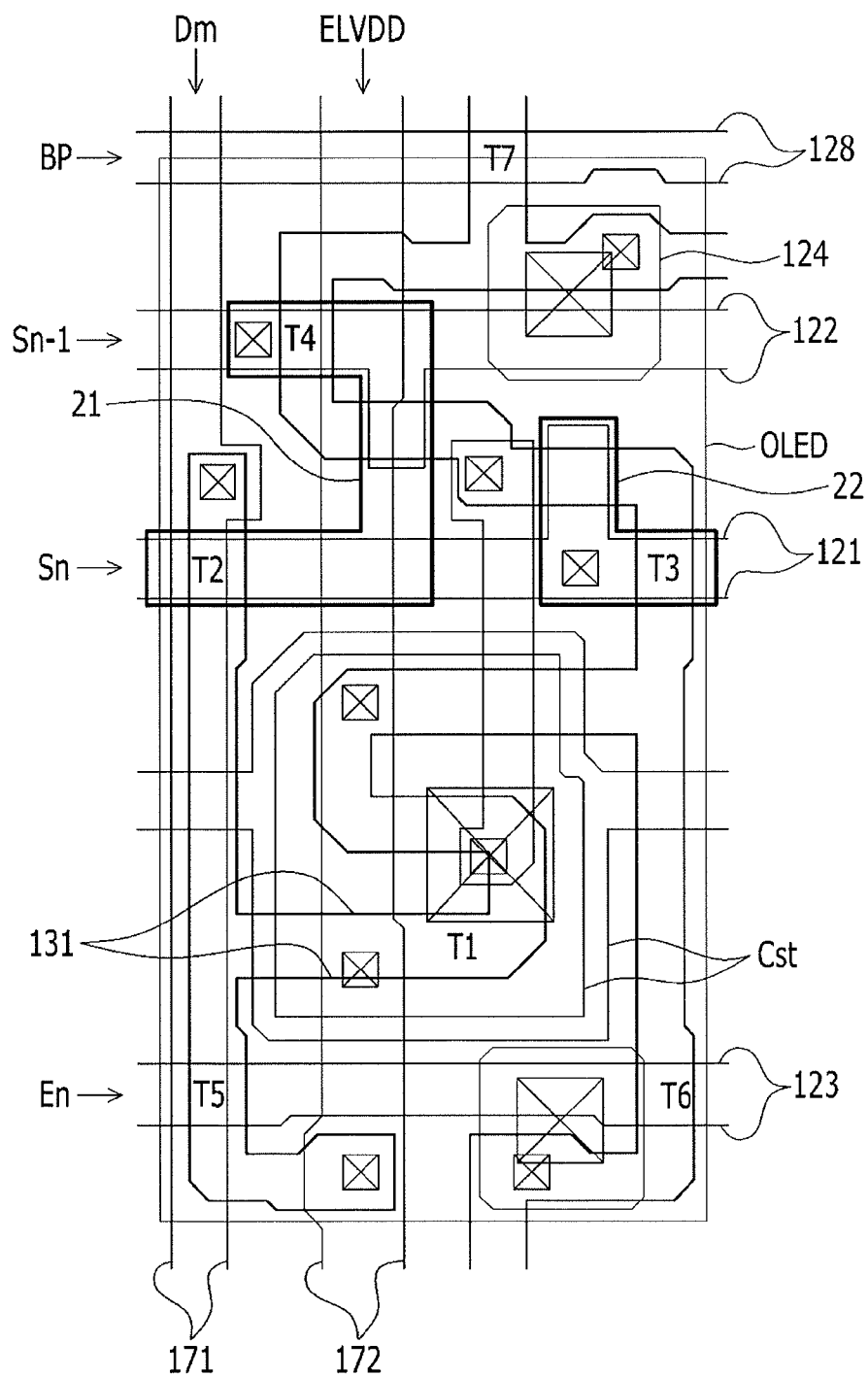
FIG. 3 is one layout of the transistors and capacitor of the pixel in FIG. 1.
Figure 4:
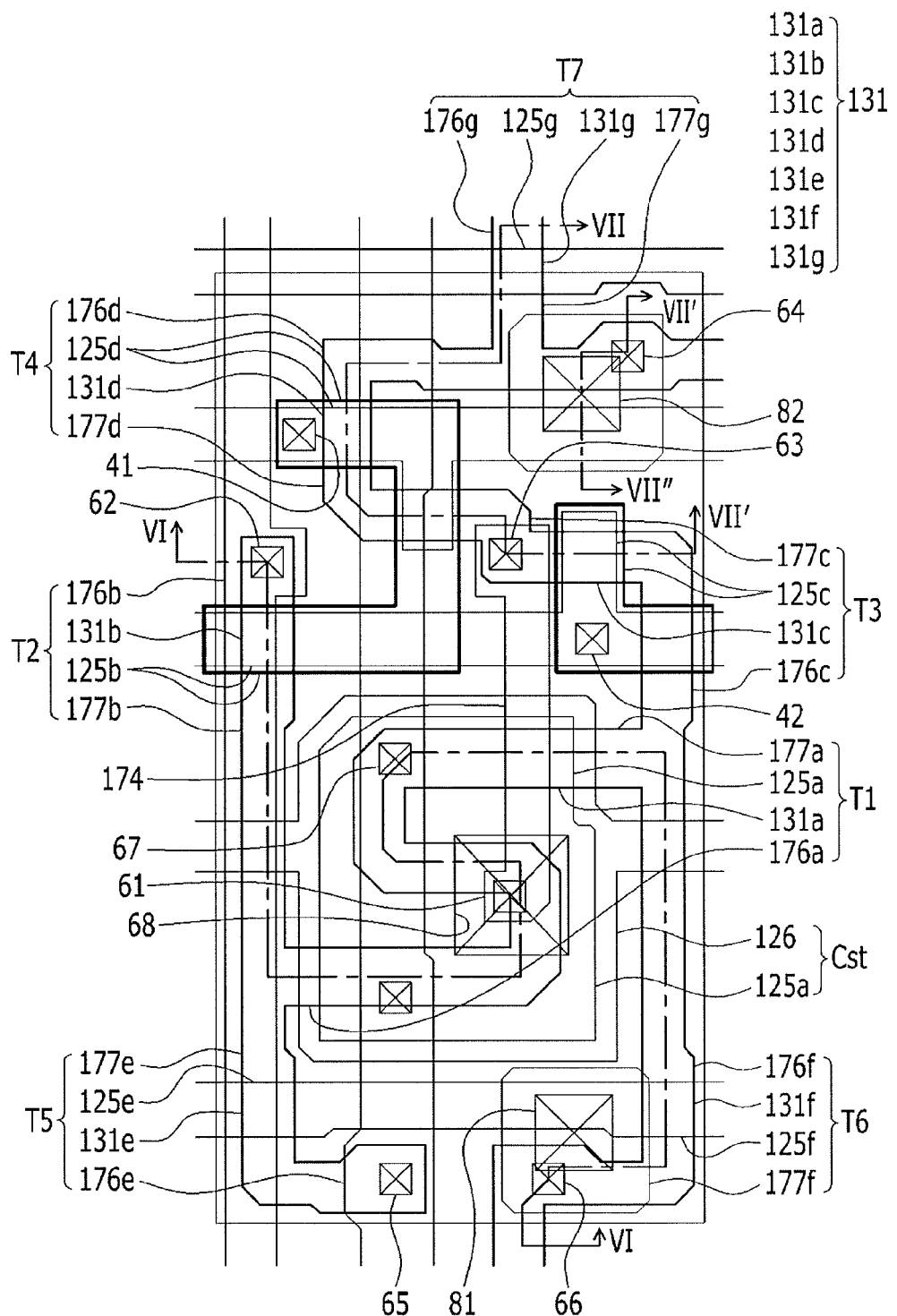
FIG. 4 illustrates a detailed view of the layout in FIG. 3.
Figure 5:
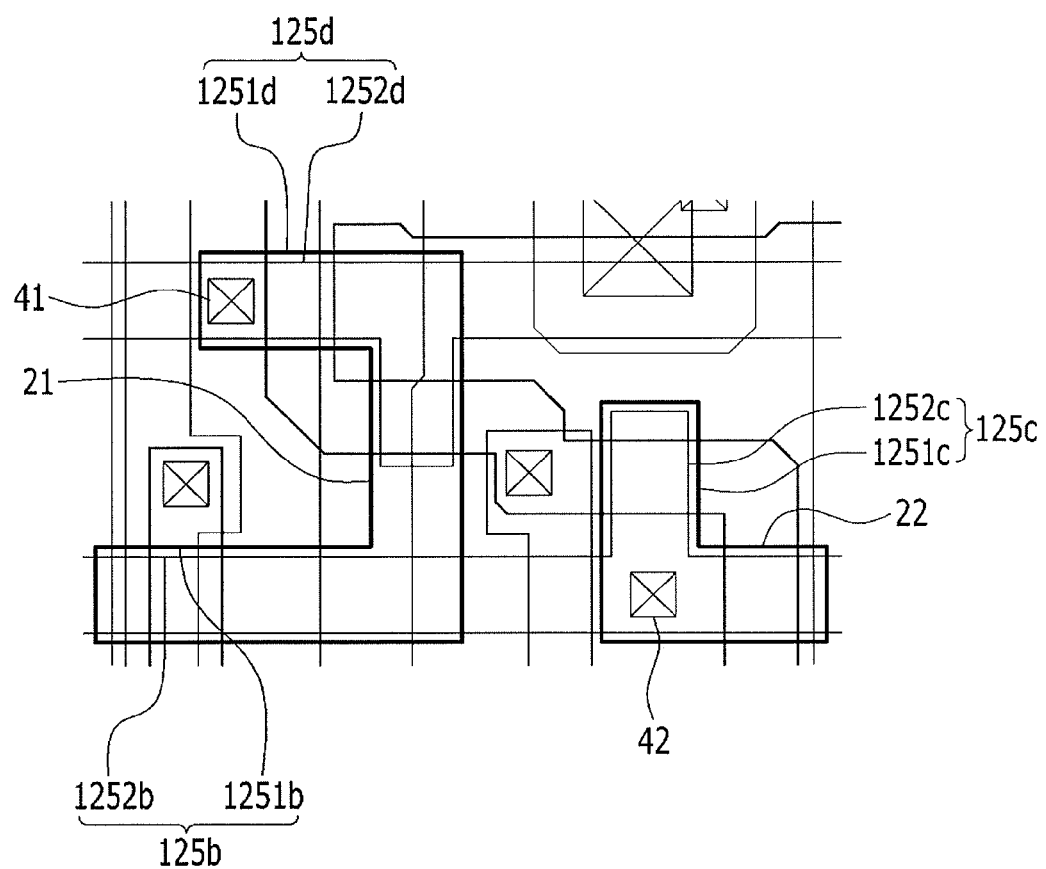
FIG. 5 illustrates a partially enlarged view of FIG. 4.
Figure 6:
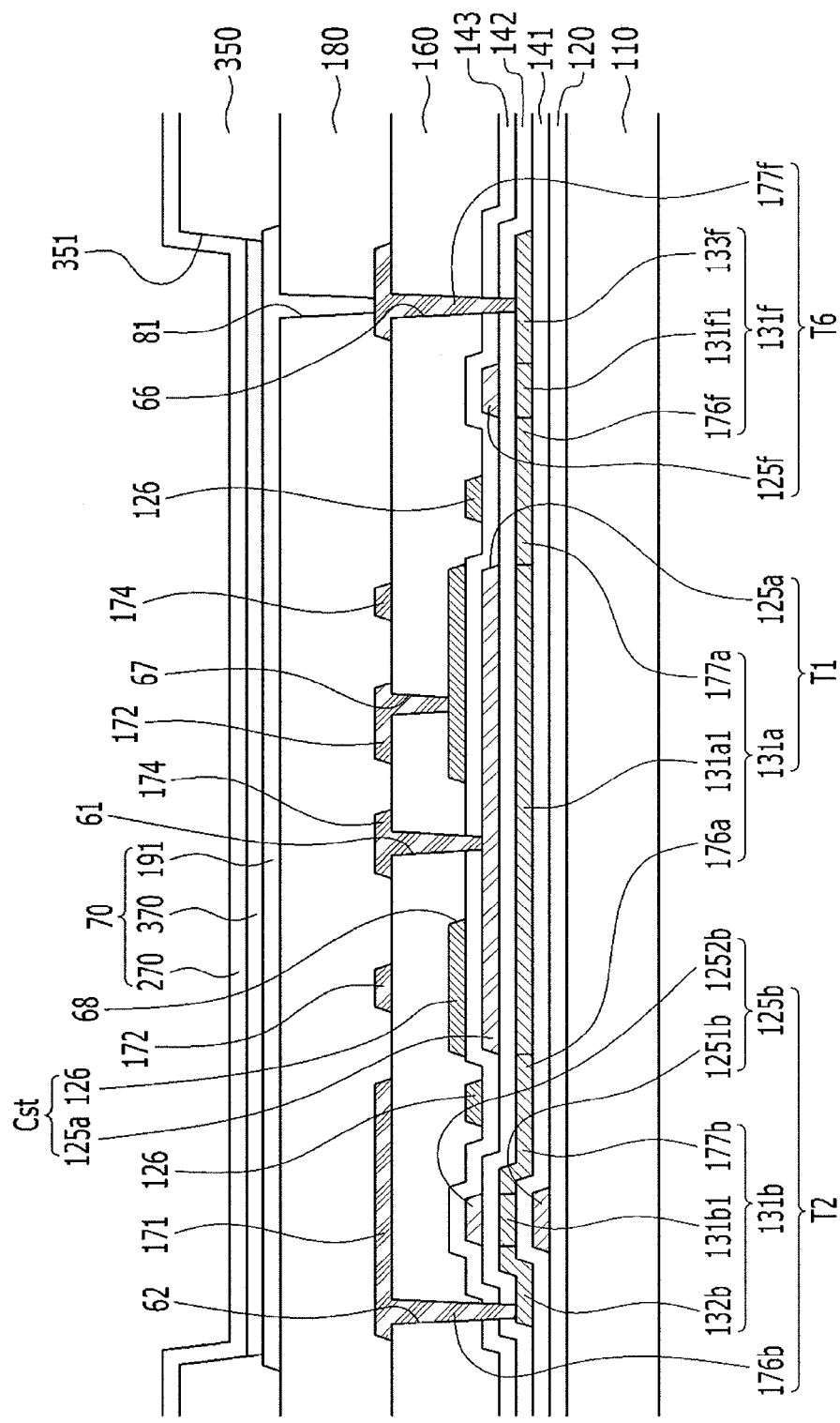
FIG. 6 illustrates a view taken along section line VI-VI in FIG. 4.
Figure 7:
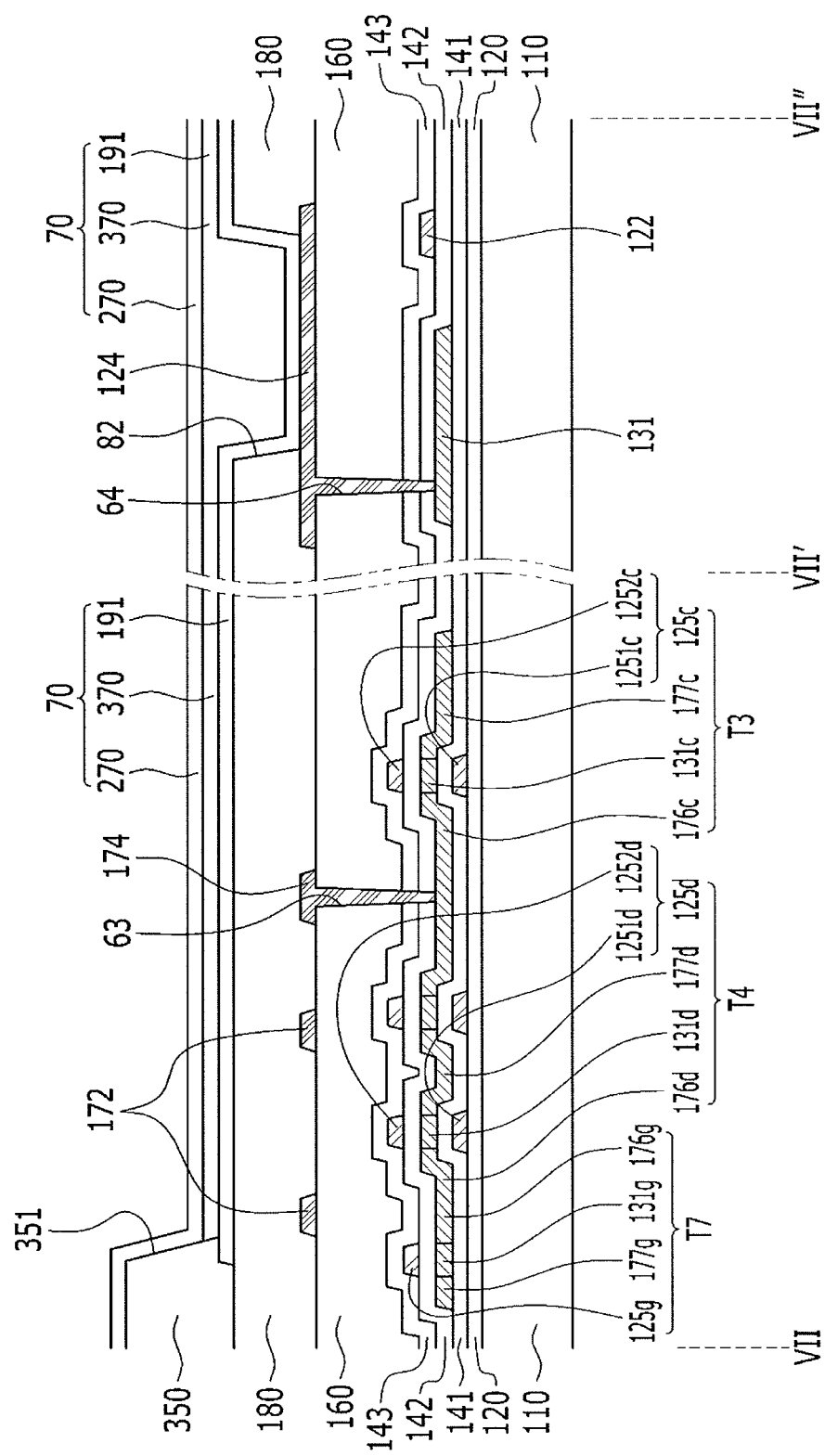
FIG. 7 illustrates views along section lines VII-VII' and VII'-VII" in FIG. 4.
Figure 8:
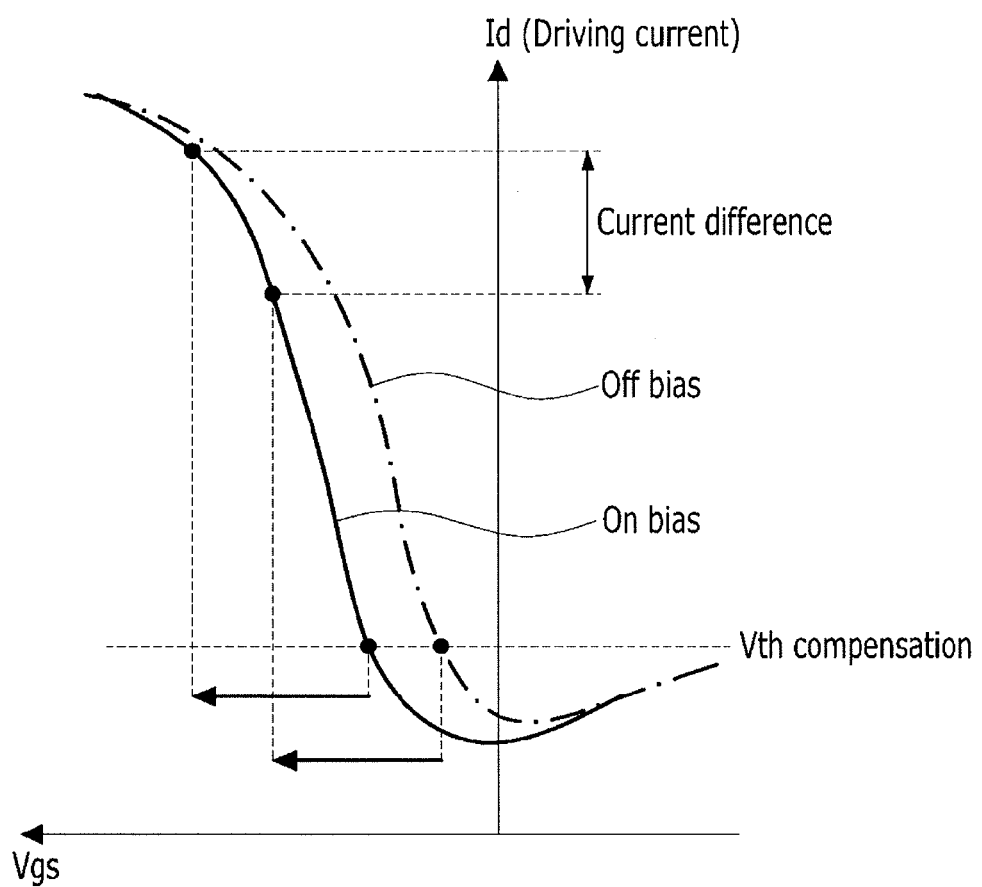
FIG. 8 illustrates a hysteresis curve for one type of display device.

FIG. 3 illustrates an example of a layout of the pixel in FIG. 1. FIG. 4 is a more detailed view of the layout in FIG. 3. FIG. 5 is a partially enlarged view of FIG. 4. FIG. 6 is a cross-sectional view of the organic light emitting diode display of FIG. 4 taken along line VI-VI. FIG. 7 is a cross-sectional view of the organic light emitting diode display of FIG. 4 taken along line VII-VII' and VII'-VII". FIG. 8 illustrates a hysteresis curve which occurs in another type of organic light emitting diode display device.

As illustrated in FIG. 3, the pixel includes a scan line 121, a previous scan line 122, an emission control line 123, and a bypass control line 128. These lines respectively apply a scan signal Sn, a previous scan signal Sn−1, an emission control signal En, and a bypass signal BP to the pixel. These lines may be formed in a row direction, and may include a data line 171 and a driving voltage line 172 which cross the scan line 121, the previous scan line 122, the emission control line 123, and the bypass control line 128. The data line 171 and the driving voltage line 12 apply a data signal Dm and a driving voltage ELVDD, respectively. The initialization voltage Vint is transferred to the driving thin film transistor T1, via initialization transistor T4, from the organic light emitting diode OLED through the initialization voltage line 124.

The driving thin film transistor T1, switching thin film transistor T2, compensation transistor T3, initialization transistor T4, operation control transistor T5, emission control transistor T6, bypass transistor T7, storage capacitor Cst, and organic light emitting diode OLED are formed in the pixel.

The driving thin film transistor T1, switching thin film transistor T2, compensation transistor T3, initialization transistor T4, operation control transistor T5, emission control transistor T6, and bypass transistor T7 are formed along a semiconductor layer 131.

The semiconductor layer 131 is curved in various shapes. The semiconductor layer 131 may be made for example, of polysilicon or oxide semiconductor. The oxide semiconductor may include one of an oxide based on titanium (Ti), hafnium (Hf), zirconium (Zr), aluminum (Al), tantalum (Ta), germanium (Ge), zinc (Zn), gallium (Ga), tin (Sn) or indium (In), zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), or hafnium-indium-zinc oxide (Hf—In—Zn—O), which are complex oxides. When the semiconductor layer 131 is made of an oxide semiconductor, a separate passivation layer may be added to protect the oxide semiconductor from damage resulting from high temperatures and/or other external influences.

The semiconductor layer 131 includes a channel region, a source region, and a drain region. The channel region allows for formation of a channel and is doped with N-type impurity or P-type impurity. The source and drain regions are formed at respective sides of the channel region, and may be formed by doping a doped impurity having a conductivity type opposite to the conductivity type of the channel region.

As illustrated in FIGS. 3 to 5, pixel 1 includes driving thin film transistor T1, switching thin film transistor T2, compensation transistor T3, initialization transistor T4, operation control transistor T5, emission control transistor T6, bypass transistor T7, storage capacitor Cst, and organic light emitting diode OLED. The transistors T1, T2, T3, T4, T5, T6, and T7 are formed along the semiconductor layer 131. The semiconductor layer 131 includes a driving semiconductor layer 131a formed in the driving thin film transistor T1, a switching semiconductor layer 131*b* formed in the switching thin film transistor T2, a compensation semiconductor layer 131*c* formed in the compensation transistor T3, an initialization semiconductor layer 131*d* formed in the initialization transistor T4, an operation control semiconductor layer 131*e* formed in the operation control transistor T5, an emission control semiconductor layer 131*f* formed in the emission control transistor T6, and bypass semiconductor layer 131*g* formed in the bypass thin film transistor T7.

The driving thin film transistor T1 includes a driving semiconductor layer 131*a*, a driving gate electrode 125*a*, a driving source electrode 176*a*, and a driving drain electrode 177*a*.

The driving semiconductor layer 131 a is curved and may have a zigzag shape. As a result, the curved driving semiconductor layer 131*a* is formed. Thus, the driving semiconductor layer 131*a* may be formed to have a relatively long length in a narrow space. Accordingly, because a driving channel region 131 al of driving semiconductor layer 131*a* may be formed to have a long length, a driving range of the gate voltage applied to the driving gate electrode 125*a* may be increased. Because the driving range of a gate voltage is increased, a gray scale level of light emitted from the organic light emitting diode OLED may be more finely controlled by changing the magnitude of the gate voltage. This may have the effect of enhancing resolution of the organic light emitting diode display, and thereby improve display quality. The shape of such a driving semiconductor layer 131*a* may be modified in various ways including but not limited to a reverse S, S, M, or W configuration.

The driving source electrode 176*a* corresponds to the driving source region 176*a*, which is doped with the impurity in the driving semiconductor layer 131*a*. The driving drain electrode 177*a* corresponds to the driving drain electrode 177*a*, which is doped with the impurity in the driving semiconductor layer 131*a*. The driving gate electrode 125*a* overlaps the driving semiconductor layer 131*a* and is formed on the same layer as the scan line 121, the previous scan line 122, the emission control line 123, a second switching gate electrode 1252*b*, a second compensation gate electrode 1252*c*, a second initialization gate electrode 1252*d*, the operation control gate electrode 125*e*, and the emission control gate electrode 125*f* using the same material.

The switching thin film transistor T2 includes a switching semiconductor layer 131*b*, a switching gate electrode 125*b*, a switching source electrode 176*b*, and a switching drain electrode 177*b*. The switching gate electrode 125*b* includes a first switching gate electrode 1251*b* and a second switching gate electrode 1252*b*, which are foamed on different layers to overlap each other. The first switching gate electrode 1251*b* is a part of the first back bias line 21. The first switching gate electrode 1251*b* is connected to the previous scan line 122 through the first back bias line 21. The second switching gate electrode 1252*b* is a part of the scan line 121. In this case, the first back bias line 21 is connected to the previous scan line 122 through a contact hole 41 formed in a first gate insulating layer 141 and a second gate insulating layer 142.

Accordingly, the previous scan signal Sn–1 is transferred to the first switching gate electrode 1251*b* and the scan signal Sn is transferred to the second switching gate electrode 1252*b*. Therefore, the switching thin film transistor T2 is turned on by the previous scan signal Sn–1 before the switching operation by the scan signal Sn. Thus, an on-bias data signal is applied to the driving thin film transistor T1. Because the on-bias data signal is applied continuously to the driving thin film transistor T1, hysteresis caused by a difference between the off-bias and on-bias states as illustrated in FIG. 8 does not occur, thereby improving response speed.

The switching source electrode 176*b*, which is a part of data line 171, is connected to the switching source region 132*b*, which is doped with the impurity in the switching semiconductor layer 131*b* through a contact hole 62. The switching drain electrode 177*b* is doped with an impurity in the switching semiconductor layer 13 lb.

The compensation transistor T3 includes a compensation semiconductor layer 131*c*, compensation gate electrode 125*c*, compensation source electrode 176*c*, and compensation drain electrode 177*c*. Compensation source electrode 176*c* corresponds to compensation source region 176*c* doped with an impurity in the compensation semiconductor layer 131*c*. The compensation drain electrode 177*c* corresponds to the compensation drain electrode 177*c* doped with an impurity.

The compensation gate electrode 125*c* includes a first compensation gate electrode 1251*c* and a second compensation gate electrode 1252*c* which are formed on different layers. The first compensation gate electrode 1251*c* is a part of the second back bias line 22, the first compensation gate electrode 1251*c* is connected to the scan line 121 through the second back bias line 22, and the second compensation gate electrode 1252*c* is directly connected to the scan line 121.

In this case, the second back bias line 22 is connected to the scan line 121 through the contact hole 42 formed in the first gate insulating layer 141 and the second gate insulating layer 142. Because the first compensation gate electrode 1251*c* and second compensation gate electrode 1252*c* are both connected to scan line 121 and have a vertical double-gate electrode structure, the same off voltage is simultaneously applied to the first and second compensation gate electrodes 1251*c* and 1252*c*, thereby reducing or minimizing off current.

The initialization transistor T4 includes an initialization semiconductor layer 131*d*, initialization gate electrode 125*d*, initialization source electrode 176*d*, and initialization drain electrode 177*d*. The initialization source electrode 176*d* corresponds to initialization source electrode 176*d* doped with an impurity. The initialization drain electrode 177*d* is also doped with an impurity.

The initialization gate electrode 125*d* includes a first initialization gate electrode 1251*d* and a second initialization gate electrode 1252*d* which are formed on different layers. Because the first initialization gate electrode is a part of the first back bias line 21, the first initialization gate electrode 1251*d* is connected to the previous scan line 122 through the first back bias line 21. The second initialization gate electrode 1252*d* is directly connected to the previous scan line 122. The first initialization gate electrode 1251*d* and the second initialization gate electrode 1252*d* are both connected to the previous scan line 122 and have a vertical double-gate electrode structure. Accordingly, the same off voltage is simultaneously applied to the first and second initialization gate electrodes 1251*d* and 1252*d*, thereby reducing or minimizing off current.

Because the compensation gate electrode 125*c* and initialization gate electrode 125*d* have a vertical double-gate electrode structure, an area occupied by the compensation gate electrode 125*c* and initialization gate electrode 125*d* may be reduced, thereby implementing high resolution.

The operation control transistor T5 includes an operation control semiconductor layer 131*e*, operation control gate electrode 125*e*, operation control source electrode 176*e*, and operation control drain electrode 177*e*. The operation control source electrode 176e, which is a part of the driving voltage line 172, is connected to the operation control semiconductor layer 131e through a contact hole 65. The operation control drain electrode 177e is doped with an impurity in operation control semiconductor layer 131e.

The emission control transistor T6 includes an emission control semiconductor layer 131f, emission control gate electrode 125f, emission control source electrode 176f, and emission control drain electrode 177f. The emission control source electrode 176f is doped with an impurity in emission control semiconductor layer 131f. Emission control drain electrode 177f is connected to emission control semiconductor layer 131f through a contact hole 66.

The bypass thin film transistor T7 includes a bypass semiconductor layer 131g, bypass gate electrode 125g, bypass source electrode 176g, and bypass drain electrode 177g. The bypass source electrode 176g corresponds to the bypass source region 176g doped with an impurity in the bypass semiconductor layer 131g. The bypass drain electrode 177g is doped with an impurity in bypass semiconductor layer 131g. Bypass source electrode 176g is directly connected to emission control drain region 133f.

One end of driving semiconductor layer 131a of driving thin film transistor T1 is connected to switching semiconductor layer 131b and operation control semiconductor layer 131e. The other end of driving semiconductor layer 131a is connected to compensation semiconductor layer 131c and emission control semiconductor layer 131f. Accordingly, the driving source electrode 176a is connected to the switching drain electrode 177b and the operation control drain electrode 177e, and the driving drain electrode 177a is connected to the compensation source electrode 176c and the emission control source electrode 176f.

The storage capacitor Cst includes a first storage capacitor plate 125a and a second storage capacitor plate 126, with a third gate insulating layer 143 therebetween. The first storage capacitor plate 125a may serve as the driving gate electrode 125a. The third gate insulating layer 143 may serve as a dielectric material. Storage capacitance may be determined by charge stored in the storage capacitor Cst and a voltage between capacitor plates 125a and 126.

The first storage capacitor plate 125a, which also serves as the driving gate electrode 125a, is connected to a connecting member 174 through a capacitance opening 68 formed in the second storage capacitor plate 126 and a contact hole 61 formed in the third gate insulating layer 143 and interlayer insulating layer 160. The connecting member 174 is formed on the same layer parallel to the data line 171. The connecting member 174 connects the driving gate electrode 125a and compensation drain electrode 177c of the compensation thin film transistor T3.

Accordingly, the storage capacitor Cst has a storage capacitance corresponding to a difference between the driving voltage ELVDD, transferred to the second storage capacitor plate 126 through driving voltage line 172, and the gate voltage of the driving gate electrode 125a. Further, in order to ensure an area of the storage capacitor reduced by the driving semiconductor layer having a curved portion, the storage capacitor Cst may overlap the driving semiconductor layer 131a, thereby sufficiently ensuring a storage capacitance even at high resolution The switching thin film transistor T2 serves as a switching element, to select the pixel to emit light. The switching gate electrode 125b is connected to the scan line 121. The switching source electrode 176b is connected to data line 171. The switching drain electrode 177b is connected to the driving thin film transistor T1 and operation control transistor T5. In addition, the emission control drain electrode 177f of the emission control transistor T6 is directly connected to a pixel electrode 191 of organic light emitting diode 70.

Referring to FIGS. 6 and 7, the operation control transistor T5 may have an laminated structure that is almost the same as a laminating structure of the emission control transistor T6. A buffer layer 120 is formed on a substrate 110, and an insulation substrate made, for example, of glass, quartz, ceramic, or plastic is formed on the substrate 110.

A first switching gate electrode 1251b, first compensation gate electrode 1251c, and first initialization gate electrode 1251d are formed on the buffer layer 120. A first gate insulating layer 141 is formed on the first switching gate electrode 1251b, first compensation gate electrode 1251c, and first initialization gate electrode 1251d.

A driving semiconductor layer 131a, switching semiconductor layer 131b, compensation semiconductor layer 131c, initialization semiconductor layer 131d, emission control semiconductor layer 131f, and bypass semiconductor layer 131 g are formed on the first gate insulating layer 141.

The driving semiconductor layer 131a includes a driving source region 176a and a driving drain region 177a, which face each other with a driving channel region 131a1 and a driving channel region 131a1 therebetween. The switching semiconductor layer 131b includes a switching source region 132b and a switching drain region 177b, which face each other with a switching channel region 131b1 and a switching channel region 131b1 therebetween.

The compensation semiconductor layer 131 c includes a compensation channel region 131c, compensation source region 176c, and compensation drain region 177c. The initialization semiconductor layer 131 d includes an initialization channel region 131d, initialization source region 176d, and initialization drain region 177d. The emission control semiconductor layer 131f includes an emission control channel region 131f1, emission control source region 176f, and emission control drain region 133f. The bypass semiconductor layer 131g includes a bypass channel region 131g, bypass source region 176g, and bypass drain region 177g.

A second gate insulating layer 142 is formed on the driving semiconductor layer 131a, switching semiconductor layer 131b, compensation semiconductor layer 131c, initialization semiconductor layer 131d, emission control semiconductor layer 131f, and bypass semiconductor layer 131g. On the first gate insulating layer 142, a scan line 121, a previous scan line 122, an emission control line 123, and gate lines 121, 122, 123, 1252b, 1252c, 1252d, and 125f are formed. The scan line 121 includes a second switching gate electrode 1252b and a second compensation gate electrode 1252c. The previous scan line 122 includes a second initialization gate electrode 1252d. The emission control line 123 includes an emission control gate electrode 125f. Gate line 125a including a driving gate electrode (first storage capacitor) 125a.

A third gate insulating layer 143 is formed on gate lines 121, 122, 123, 125a, 1252b, 1252c, 1252d, and 125f, and the second gate insulating layer 142. The first gate insulating layer 141 to the third gate insulating layer 143 are formed, or example, of silicon nitride (SiNx) or silicon oxide (SiO$_2$).

A second storage capacitor 126 overlapping the first storage capacitor 125a is formed on the third gate insulating layer 143. An interlayer insulating layer 160 is formed on the third gate insulating layer 143 and the second storage capacitor 126. The interlayer insulating layer 160 may be formed by using, for example, a ceramic-based material such as silicon nitride (SiN$_x$) or silicon oxide (SiO$_2$).

Data wires 171, 172, 174, 176b, 177f, and 124 (including a data line 171 including a switching source electrode 176b, a driving voltage line 172, a connecting member 174, an emission control drain electrode 177f, and an initialization voltage line 124) are formed on the interlayer insulating layer 160.

The switching source electrode 176b is connected to the switching semiconductor layer 131b through the contact hole 62 formed in the second gate insulating layer 142, the third gate insulating layer 143, and the interlayer insulating layer 160, The emission control drain electrode 177f is connected to the emission control semiconductor layer 131f through a contact hole 66 formed in the second gate insulating layer 142, the third gate insulating layer 143, and the interlayer insulating layer 160. The initialization voltage line 124 is connected to the semiconductor layer 131 through a contact hole 64 formed in the second gate insulating layer 142, the third gate insulating layer 143, and the interlayer insulating layer 160.

The driving voltage line 172 is connected to the second storage capacitor 126 through a contact hole 67 formed in the interlayer insulating layer 160. One end of the connecting member 174 is formed with the driving gate electrode 125a through the contact hole 61 formed in the third gate insulating layer 143 and the interlayer insulating layer 160. The other end of the connecting member 174 is connected to the compensation drain electrode 176c through a contact hole 63 formed in the second gate insulating layer 124, the third gate insulating layer 143, and the interlayer insulating layer 160.

A passivation layer 180 covers data wires 171, 172, 174, 176b, 177f, and 124, and is formed on the interlayer insulating layer 160. A pixel electrode 191 is formed on the passivation layer 180. The pixel electrode 191 is connected to the pixel electrode 191 through a contact hole 81 formed in the passivation layer 180. The initialization voltage line 124 is connected to the pixel electrode 191 through a contact hole 82 formed in the passivation layer 180.

A partition wall 350 is formed on the edge of the pixel electrode 191 and the passivation layer 180. The partition wall 350 has a partition wall opening 351 exposing the pixel electrode 191. The partition wall 350 may be made, for example, of a resin such as polyacrylates resin, polyimides, and/or a silica-based inorganic material.

An organic emission layer 370 is fonned on the pixel electrode 191 exposed by the partition wall opening 351. A common electrode 270 is formed on the organic emission layer 370. As such, the organic light emitting diode 70 (including pixel electrode 191, organic emission layer 370, and common electrode 270) is formed.

In one embodiment, the pixel electrode 191 may be an anode serving as a hole injection electrode and common electrode 270 may be a cathode serving as an electron injection electrode. In another embodiment, the pixel electrode 191 may be the cathode and the common electrode 270 may be the anode. In operation, holes and electrons are injected into organic emission layer 370 from the pixel electrode 191 and the common electrode 270, respectively, and an excitons are generated by coupling the injected holes and electrons. When the excitons fall from an excited state to ground, light is emitted.

The organic emission layer 370 may be made of a low- or a high-molecular organic material, for example, poly 3,4-ethylenedioxythiophene (PEDOT). Further, the organic emission layer 370 may be formed as a multilayer including an emission layer, and one or more of a hole injection layer (HIL), a hole transporting layer (HTL), an electron transporting layer (ETL), or an electron injection layer (EIL). In the case where the organic emission layer 370 includes all of the aforementioned layers, the hole injection layer (HIL) may be disposed on the anode (e.g., pixel electrode 191) and the hole transporting layer (HTL), emission layer, electron transporting layer (ETL), and electron injection layer (EIL) may be sequentially laminated thereon.

The organic emission layer 370 may include a red organic emission layer emitting red light, a green organic emission layer emitting green light, and a blue organic emission layer emitting blue light. The red, green, and blue organic emission layers are formed in a red pixel, green pixel, and blue pixel, respectively, to thereby implement a color image.

The organic emission layer 370 may implement a color image by laminating the red, green, and blue organic emission layers together in the red pixel, green pixel, and blue pixel. A red color filter, green color filter, and blue color filter for each pixel may then be formed. In another example, white organic emission layers emitting white light are formed in the red, green, and blue pixels, and a red color filter, green color filter, and blue color filter are formed for each pixel, to thereby implement a color image.

In implementing a color image using the white organic emission layer and color filters, a deposition mask for depositing the red organic emission layer, green organic emission layer, and blue organic emission layer on respective red, green, and blue pixels does not need to be used.

The white organic emission layer used in another example may be formed by one organic emission layer, and may include a configuration formed to emit white light by laminating a plurality of organic emission layers. For example, the white organic emission layer may emit white light by combining at least one yellow organic emission layer and at least one blue light emitting layer. In another example, the white organic emission layer may emit white light by combining at least one cyan organic emission layer and at least one red light emitting layer. In another example, the white organic emission layer may emit white light by combining at least one magenta organic emission layer and at least one green light emitting layer, and the like.

An encapsulation member protecting the organic light emitting element 70 may be formed on the common electrode 270. The encapsulation member may be encapsulated on substrate 110, for example, by a sealant. Also, the encapsulation member may be made of various materials such as glass, quartz, ceramic, plastic, and/or metal. A thin film encapsulation layer may be formed by depositing an inorganic layer and an organic layer on the common electrode 270, without the sealant.

In accordance with one embodiment, a first back bias line is connected to a previous scan line to receive a previous scan signal. In another embodiment, the first back bias line and the previous scan line are separated from each other, and the previous scan signal is directly transferred to the first back bias line.

Figure 9:
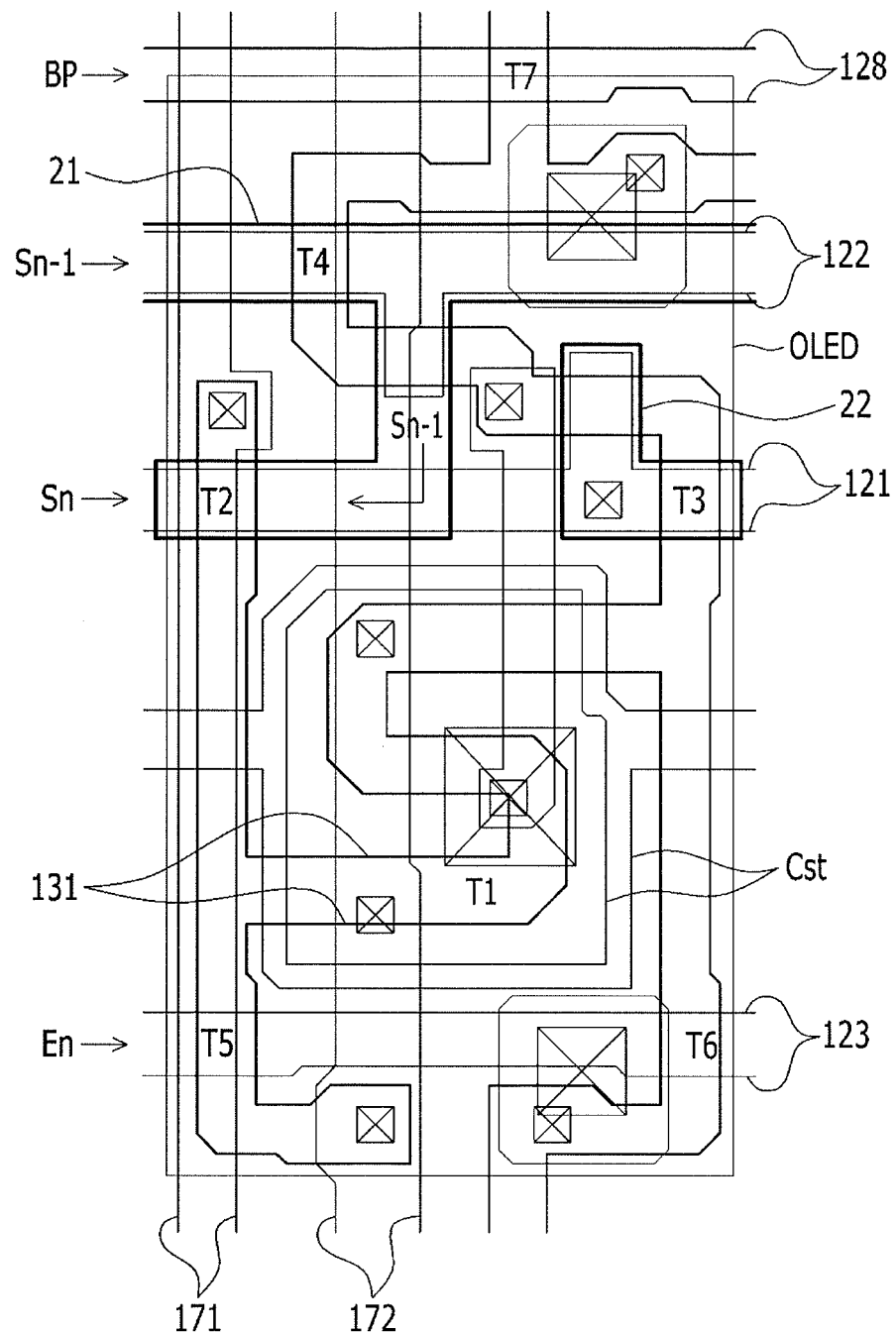
FIG. 9 illustrates another embodiment of a layout of the transistors and a capacitor of a pixel.
Figure 10:
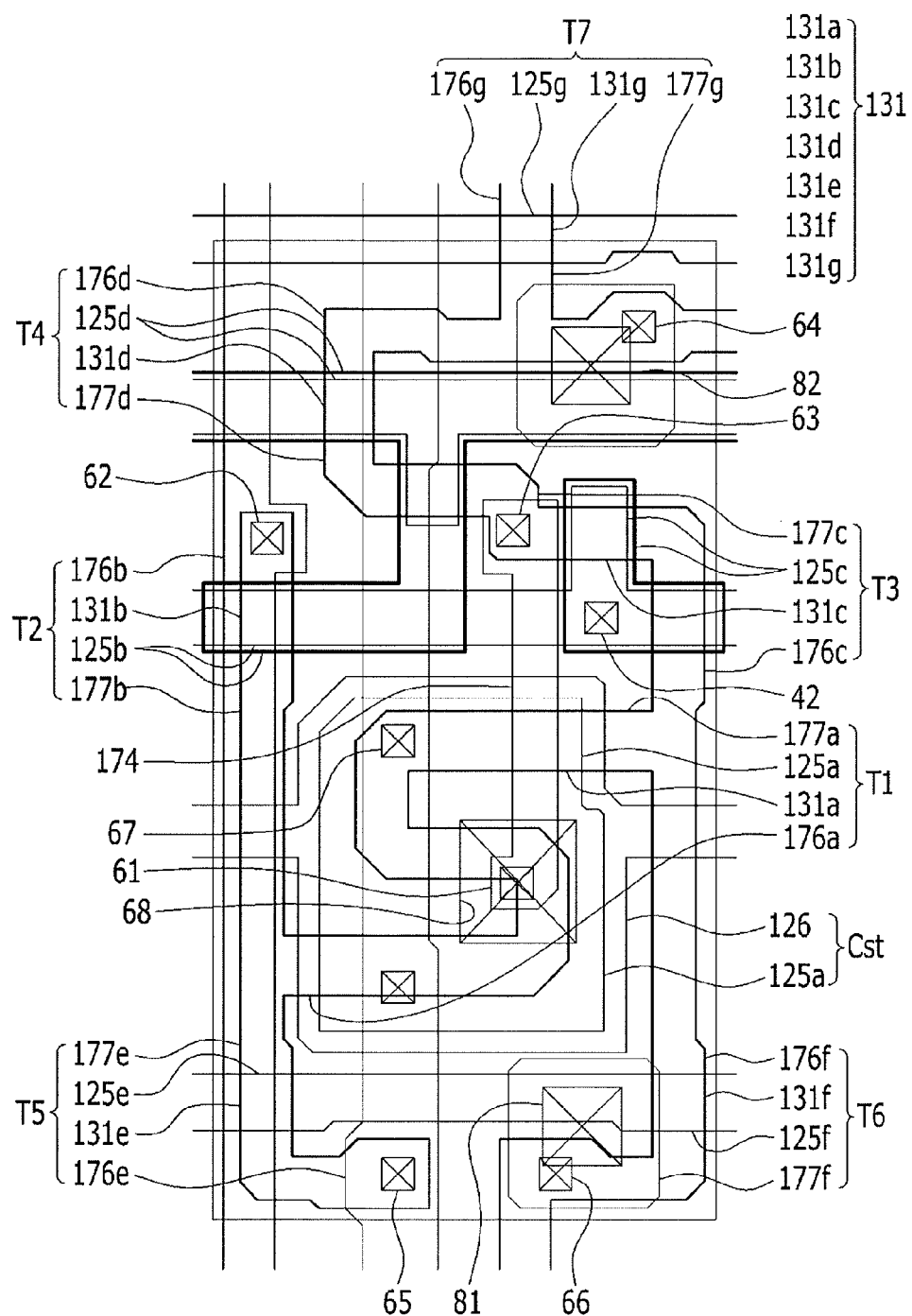
FIG. 10 illustrates a detailed view of the layout in FIG. 9.

FIG. 9 illustrates another embodiment of an OLED pixel that includes a plurality of transistors and a capacitor, and FIG. 10 provides a more detailed view of a layout of the pixel in FIG. 9. This embodiment illustrated may be the same as the embodiment in FIGS. 1 to 7, except that only the first back bias line and previous scan line are separated from each other.

As illustrated in FIGS. 9 and 10, a switching thin film transistor T2 includes a switching semiconductor layer 131b, switching gate electrode 125b, switching source electrode 176b, and switching drain electrode 177b. The switching gate electrode 125b includes a first switching gate electrode 1251b and a second switching gate electrode 1252b, which are formed on different layers to overlap each other. The first switching gate electrode 1251b is a part of the first back bias line 21, and the second switching gate electrode 1252b is a part of the scan line 121. The previous scan signal Sn−1 is directly transferred through the first back bias line 21. As a result, the previous scan signal Sn−1 is transferred to the first switching gate electrode 1251b (which is the part of the first back bias line 21) and the scan signal Sn is transferred to the second switching gate electrode 1252b (which is the part of the scan line 121). Therefore, the switching thin film transistor T2 is turned on by the previous scan signal Sn−1 before the switching operation by the scan signal Sn. Thus, an on-bias data signal is applied to the driving thin film transistor T1. Because the on-bias data signal is continuously applied to the driving thin film transistor T1, hysteresis does not occur, thereby improving response speed of the display device.

The initialization transistor T4 includes an initialization semiconductor layer 131d, initialization gate electrode 125d, initialization source electrode 176d, and initialization drain electrode 177d.

The initialization gate electrode 125d includes a first initialization gate electrode 1251d and a second initialization gate electrode 1252d, which are formed on different layers. The first initialization gate electrode is a part of the first back bias line 21, and the second initialization gate electrode 1252d is a part of the previous scan line 122. Because the previous scan signal Sn−1 is directly transferred through the first back bias line 21, the previous scan signal Sn−1 is transferred to first initialization gate electrode 1251d (which is the part of the first back bias line 21) and the previous scan signal Sn−1 is transferred to the second initialization gate electrode 1252d (which is the part of the previous scan line 122).

The first initialization gate electrode 1251d and the second initialization gate electrode 1252d, to which the previous scan signal Sn−1 is transferred, have a vertical double-gate electrode structure. Accordingly, the same off-voltage is simultaneously applied to the first initialization gate electrode 1251d and the second initialization gate electrode 1252d, thereby reducing or minimizing off current.

A separate first back bias line transferring the previous scan signal is separated from the previous scan line. Thus, a load of the previous scan line may be reduced, even in a large-area high resolution organic light emitting diode display. Also, the driving gate electrode of the driving thin film transistor T1 may be initialized by the previous scan signal Sn−1.

In accordance with one or more of the aforementioned embodiments, an organic light emitting diode display may be provided having improved response speed at high resolution. One or more embodiments may further minimized a reduction in off current thereby resulting in improved image quality and driving efficiency.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a substrate;
    a scan line and a previous scan line formed on the substrate, the scan line to transfer a scan signal and the previous scan line to transfer a previous scan signal;
    a data line and a driving voltage line crossing the scan line, the data line to transfer a data signal and the driving voltage line to transfer a driving voltage;
    a switching transistor connected to the scan line, previous scan line, and data line;
    a driving transistor connected to the switching transistor;
    a first back bias line on the substrate;
    a first gate insulating layer over the first back bias line;
    a semiconductor layer including a switching semiconductor layer and a driving semiconductor layer on the first gate insulating layer;
    a second gate insulating layer over the semiconductor layer; and
    an organic light emitting diode connected to the driving transistor, wherein the switching transistor includes a first switching gate electrode and a second switching gate electrode on different layers, wherein the previous scan signal is transferred to the first switching gate electrode and the scan signal is transferred to the second switching gate electrode, and wherein the first switching gate electrode is a part of the first back bias line.

2. The display device as claimed in claim 1, wherein the first switching gate electrode and the second switching gate electrode overlap the switching semiconductor layer.

3. The display device as claimed in claim 2, further comprising:
    a third gate insulating layer on the second gate insulating layer and over the second switching gate electrode overlapping the switching semiconductor layer.

4. The display device as claimed in claim 3, wherein:
    the first switching gate electrode is connected to the previous scan line, and
    the second switching gate electrode is a part of the scan line.

5. The display device as claimed in claim 4, wherein:
    the first back bias line and the previous scan line are on different layers, and
    the first back bias line is connected to the previous scan line through a contact hole in the first gate insulating layer and second gate insulating layer.

6. The display device as claimed in claim 5, further comprising:
    an initialization voltage line to transfer a voltage to initialize the driving transistor; and
    an initialization transistor to transfer the initializing voltage to a driving gate electrode of the driving transistor based on the previous scan signal,
    wherein the initialization transistor includes a first initialization gate electrode and a second initialization gate electrode on different layers, and wherein the first initialization gate electrode and the second initialization gate electrode are connected to the previous scan line.

7. The display device as claimed in claim 6, wherein the first initialization gate electrode is a part of the first back bias line.

8. The display device as claimed in claim 5, further comprising:

a compensation transistor to compensate for a threshold voltage of the driving transistor based the scan signal, wherein the compensation transistor includes:
a compensation gate electrode including a first compensation gate electrode and a second compensation gate electrode on different layers, the first and second compensation gate electrodes connected to the scan line.

9. The display device as claimed in claim 8, further comprising:
a second back bias line overlapping a part of the compensation transistor and formed on a same layer as the first back bias line, wherein the first compensation gate electrode is a part of the second back bias line.

10. The display device as claimed in claim 5, wherein the driving semiconductor layer has at least one curve or bend.

11. The display device as claimed in claim 10, further comprising:
a storage capacitor including a first storage capacitor plate corresponding to the driving gate electrode on the second gate insulating layer and overlapping the driving semiconductor layer; and a second storage capacitor plate on the third gate insulating layer over the first storage capacitor plate.

12. The display device as claimed in claim 11, further comprising:
an interlayer insulating layer over the second storage capacitor;
a data line, a driving voltage line, and a connector on the interlayer insulating layer, the data line to transfer a data signal and the driving voltage line to transfer a driving voltage; and
a passivation layer over the interlayer insulating layer, the data line, the driving voltage line, and the connector, wherein the connector connects a capacitance opening in the second storage capacitor plate and the first storage capacitor plate and the compensation drain electrode of the compensation thin film transistor through a contact hole, the contact hole included in a capacitance opening in the second storage capacitor plate, the third gate insulating layer, and the interlayer insulating layer.

13. The display device as claimed in claim 12, wherein the scan line and the previous scan line are on a same layer as the first storage capacitor plate.

14. The display device as claimed in claim 13, wherein the driving voltage line is connected to the second storage capacitor plate through a contact hole in the interlayer insulating layer.

15. A display device comprising:
a substrate;
a scan line and a previous scan line formed on the substrate, the scan line to transfer a scan signal and the previous scan line to transfer a previous scan signal;
a data line and a driving voltage line crossing the scan line, the data line to transfer a data signal and the driving voltage line to transfer a driving voltage;

a switching transistor connected to the scan line, previous scan line, and data line;
a driving transistor connected to the switching transistor; an organic light emitting diode connected to the driving transistor; and a first back bias line on the substrate, wherein the switching transistor includes a first switching gate electrode and a second switching gate electrode on different layers, wherein the previous scan signal is transferred to the first switching gate electrode and the scan signal is transferred to the second switching gate electrode, wherein the first switching gate electrode is a part of the first back bias line, wherein the previous scan signal is transferred to the first switching gate electrode through the first back bias line, and the second switching gate electrode is a part of the scan line, and wherein the first back bias line is separated from the previous scan line.

16. The display device as claimed in claim 15, further comprising: an initialization voltage line to transfer a voltage to initialize the driving transistor; and
an initialization transistor to transfer the initializing voltage to the driving gate electrode of the driving transistor based on the previous scan signal, wherein the initialization transistor includes a first initialization gate electrode and a second initialization gate electrode on different layers, and wherein the first initialization gate electrode is a part of the first back bias line and the second initialization gate electrode is a part of the previous scan line.

17. A pixel, comprising:
a driving transistor;
an organic light emitting diode;
a storage capacitor connected to the driving transistor; and
a first transistor to transfer a data signal to the storage capacitor through the driving transistors;
a second transistor to compensate a threshold voltage of the driving transistor; and
a third transistor including first and second gates coupled to receive the second scan signal, wherein the first transistor includes a first gate coupled to receive a first scan signal and a second gate coupled to receive a second scan signal received before the first scan signal, and wherein the storage capacitor is connected to a first terminal of the driving transistor and the first transistor passes a data signal to a second terminal of the driving transistor based on the first and second scan signals, the first terminal corresponding to a gate of the driving transistor and the driving transistor coupled to the organic light emitting diode, and wherein the second transistor includes first and second gates to receive the first scan signal to establish a signal path between the first terminal and a third terminal of the driving transistor, and wherein the third transistor establishes a signal path between an initialization voltage and the storage capacitor.

* * * * *